United States Patent [19]

Tsang et al.

[11] Patent Number: 5,283,201
[45] Date of Patent: Feb. 1, 1994

[54] HIGH DENSITY POWER DEVICE FABRICATION PROCESS

[75] Inventors: Dah W. Tsang; John W. Mosier, II; Douglas A. Pike, Jr.; Theodore O. Meyer, all of Bend, Oreg.

[73] Assignee: Advanced Power Technology, Inc., Bend, Oreg.

[21] Appl. No.: 927,169

[22] Filed: Aug. 7, 1992

Related U.S. Application Data

[60] Continuation-in-part of Ser. No. 852,932, Mar. 13, 1992, Pat. No. 5262336 which is a continuation of Ser. No. 751,441, Aug. 28, 1991, abandoned, and Ser. No. 737,560, Jul. 26, 1991, Pat. No. 5,182,234, which is a continuation of Ser. No. 467,636, Jan. 19, 1990, abandoned, which is a division of Ser. No. 194,874, May 17, 1988, Pat. No. 4,895,810.

[51] Int. Cl.[5] .................. H01L 21/00; H01L 21/02; H01L 21/265
[52] U.S. Cl. ........................ 437/31; 437/40; 437/41; 437/50
[58] Field of Search ............... 437/6, 31, 40, 41, 50; 257/213, 288, 327, 341, 343

[56] References Cited

U.S. PATENT DOCUMENTS

| | | |
|---|---|---|
| 4,070,690 | 1/1978 | Wickstrom . |
| 4,145,703 | 3/1979 | Blanchard et al. . |
| 4,325,073 | 4/1982 | Hughes et al. ............ 437/40 |
| 4,587,712 | 5/1986 | Baliga ........................ 437/6 |
| 4,656,076 | 4/1987 | Vetanen et al. ........... 437/41 |
| 4,713,358 | 12/1987 | Bulat et al. ................ 437/6 |
| 4,994,871 | 2/1991 | Chang et al. . |
| 5,019,522 | 5/1991 | Meyer et al. .............. 437/40 |
| 5,089,434 | 2/1992 | Hollinger .................. 437/41 |
| 5,108,937 | 4/1992 | Tsai et al. .................. 437/40 |

OTHER PUBLICATIONS

Shenai, Optimum Low-Voltage Silicon Power Switches Fabricated Using Scaled Trench MOS Technologies, IEDM Tech. Digest, 1991, pp. 793–797.
Shenai, A. 55-V, 0.2-mΩ-cm² Vertical Trench Power MOSFET, Electron Dev. Lett., EDL-12, No. 3, Mar. 1991, pp. 108–110.
Baba, Y., et al., "A Study on a High Blocking Voltage UMOS-FET With A Double Gate Structure," Proceedings of 1992 International Symposium on Power Semiconductor Devices & ICs, Institute of Electrical Engineers of Japan and IEEE Electron Devices Society, Tokyo, Japan, pp. 300–302.

(List continued on next page.)

Primary Examiner—Tom Thomas
Assistant Examiner—B. Everhart
Attorney, Agent, or Firm—Marger, Johnson, McCollom & Stolowitz

[57] ABSTRACT

A recessed gate power MOSFET is formed on a substrate (20) including a P-body layer (26), N-drain layer (24) and optional P+ layer (22) for IGBT. A trenching protective layer (30) formed on the substrate upper surface (28) is patterned to define exposed areas (46) as stripes or a matrix, and protected areas. Sidewall spacers (44) of predetermined thickness (52) with inner surfaces (48) contact the protective layer sidewalls. A first trench (50) is formed in substrate areas (46) with sidewalls aligned to the sidewall spacer outer surfaces (47) and extending depthwise through the P-body layer (26) to at least a predetermined depth (56). Gate oxide (60) is formed on the trench walls and gate polysilicon (62) refills the trench to a level (64) near substrate upper surface (28). Oxide (68) between sidewall spacers (44) covers polysilicon (62). Removing the protective layer exposes upper substrate surface (28') between spacer inner surfaces (48). This area is doped to form a source layer (72) atop the body layer (26') and then trenched to form a second trench (80) having sidewalls aligned to the spacer inner surfaces. Second trench (80) defines vertically-oriented source and body layers (86, 90) stacked along gate oxide layer (60) to form vertical channels on opposite sides of second trench (80).

20 Claims, 12 Drawing Sheets

OTHER PUBLICATIONS

D. Ueda, H. Takagi, and G. Kano, "A New Vertical Power MOSFET Structure with Extremely Reduced On-Resistance-Resistance," IEEE Trans. Electron Dev. ED-32, No. 1, pp. 2–6, Jan. 1985.

D. Ueda, H. Takagi, and G. Kano, "Deep-Trench Power MOSFET with An Ron Area Product of 160 mΩ-mm$^2$," IEEE IEDM Tech. Digest, pp. 638–641, 1986.

H. R. Chang, R. D. Black, V. A. K. Temple, W. Trantraporn and B. J. Baliga, "Ultra Low Specific On-Resistance UMOS FET," IEEE IEDM, pp. 642–645, 1986.

D. Ueda, H. Tagaki, and G. Kano, "An Ultra-Low On-Resistance Power MOSFET Fabricated by Using a Fully Self-Aligned Process," IEEE Trans. Electron Dev. ED-34, No. 4, pp. 926–930, Apr. 1987.

H. R. Chang, R. D. Black, V. A. K. Temple, W. Tantraporn, and B. J. Baliga, "Self-Aligned UMOSFET's with a Specific On-Resistance of 1 mΩ-cm$^2$," IEEE Trans. Electron Dev. ED-34, No. 11, pp. 2329–2334, Nov. 1987.

H. R. Chang, B. J. Baliga, J. W. Kretchmer, and P. A. Piacente, "Insulated Gate Bipolar Transistor (IGBT) with a Trench Gate Structure," IEEE IEDM Tech. Digest, pp. 674–677, 1987.

S. Mukherjee, M. Kim, L. Tsou, and M. Simpson, "TDMOS-An Ultra-Low On-Resistance Power Transistor," IEEE Trans. Electron Dev. ED-35, No. 12, p. 2459, Dec. 1988.

C. Bulucea, M. R. Kump, and K. Amberiadis, "Field Distribution and Avalanche Breakdown of Trench MOS Capacitor Operated in Deep Depletion," IEEE Trans. Electron Dev. ED-36, No. 11, pp. 2521–2529, Nov. 1989.

K. Shenai, "Optimally Scaled Low-Voltage Vertical Power MOSFET's for High-Frequency Power Conversation", IEEE Trans. Electron Dev. vol. 37, No. 4, Apr. 1990.

S. Matsumoto, T. Ohno, K. Izumi, "Ultralow Specific on Resistance Umosfet with Trench Contacts for Source and Body Regions Realised By Selfaligned Process," Electronics Letters, vol. 27, No. 18, pp. 1640–1641, Aug. 29, 1991.

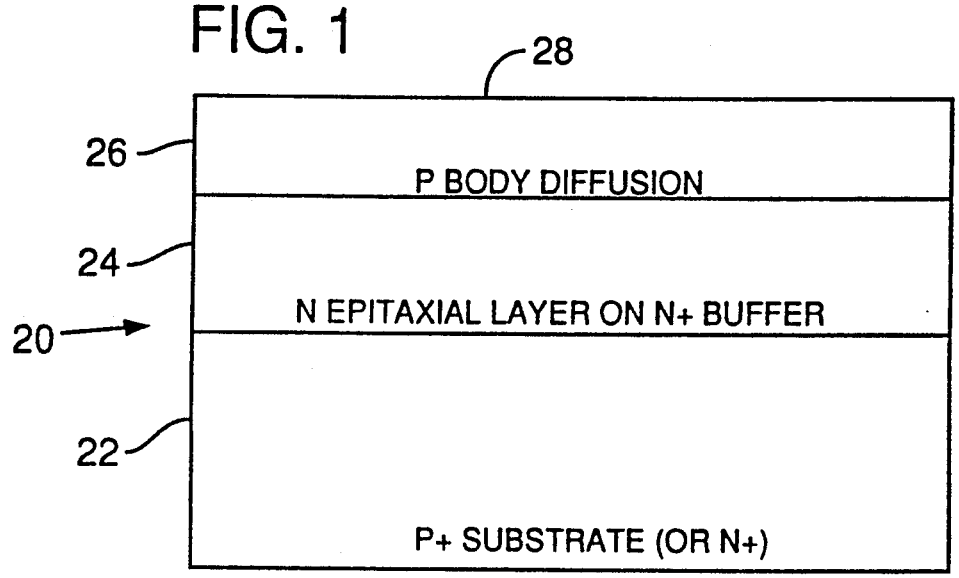
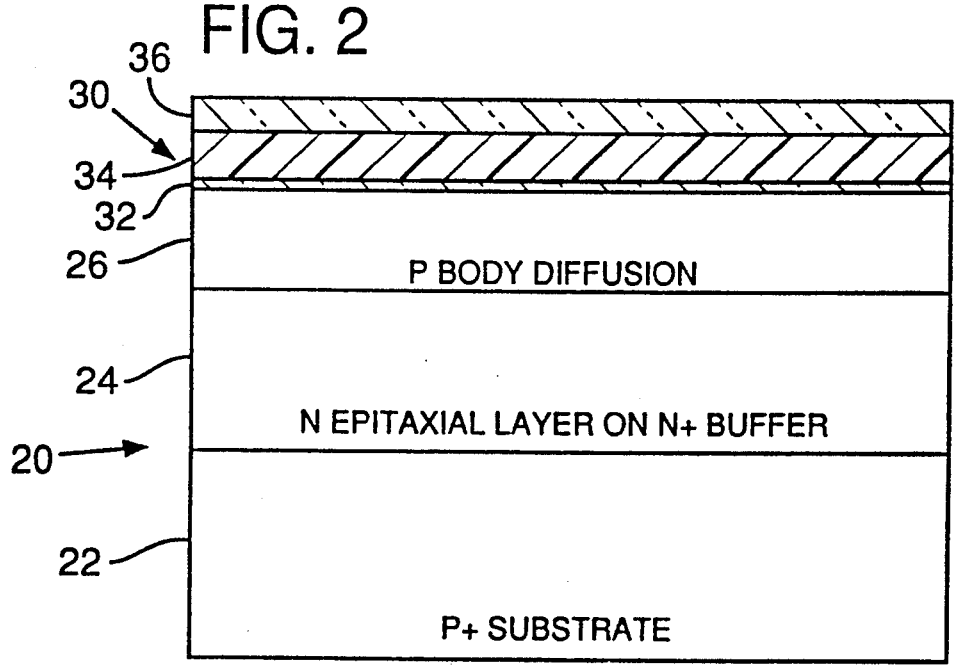

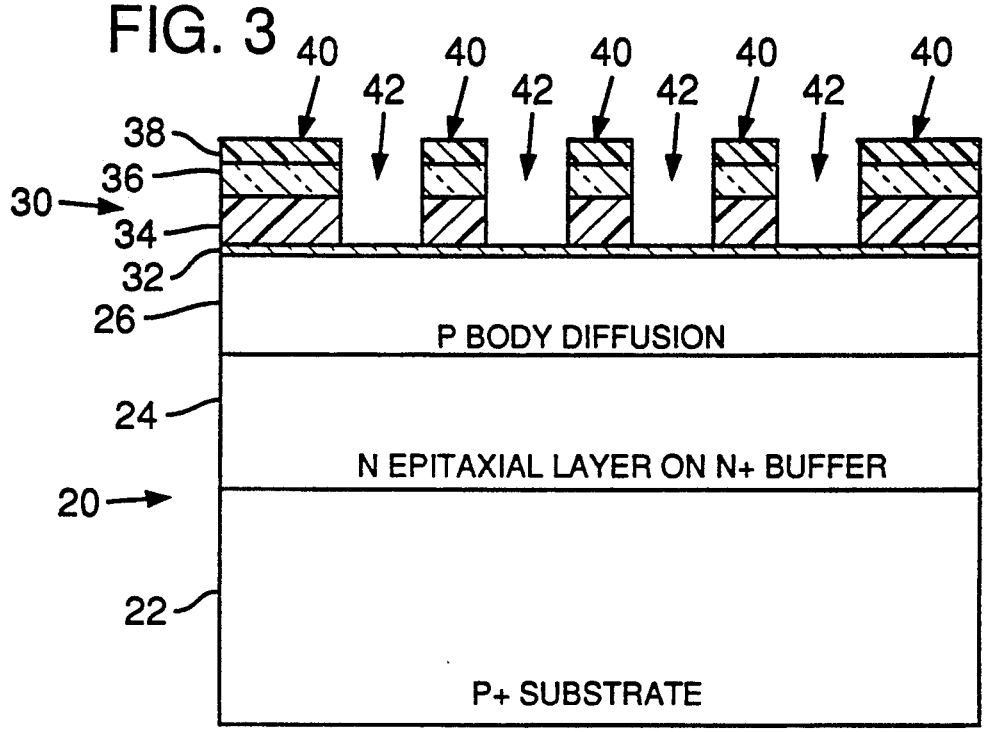
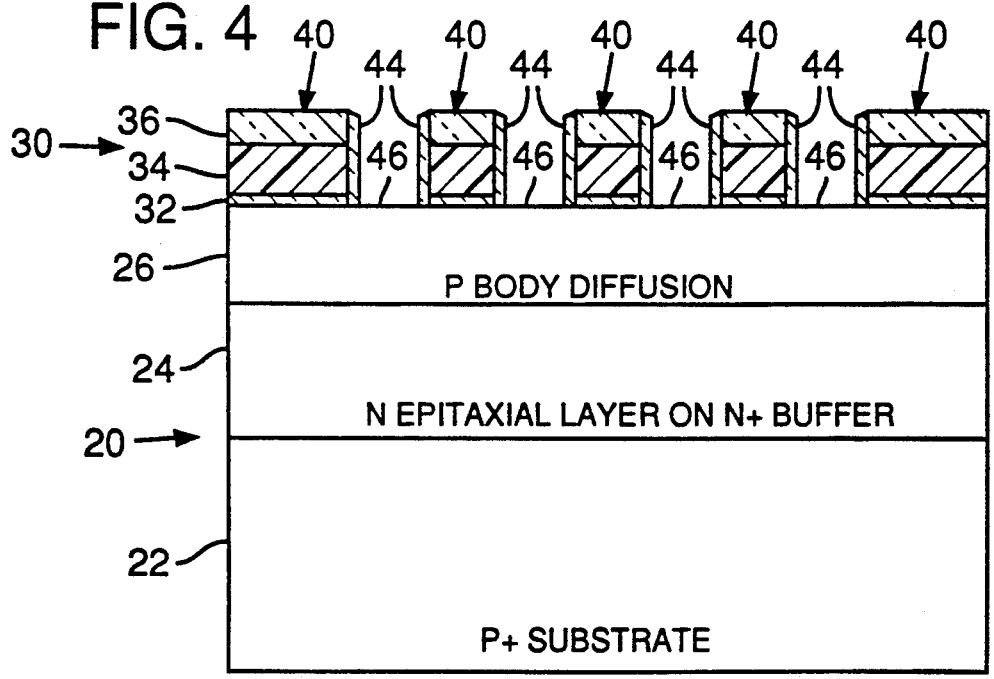

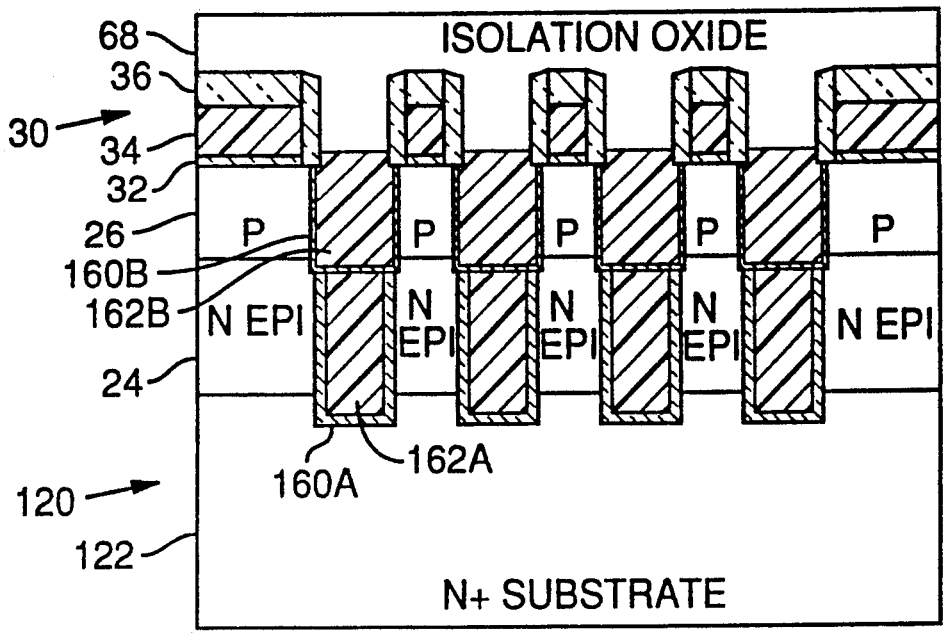
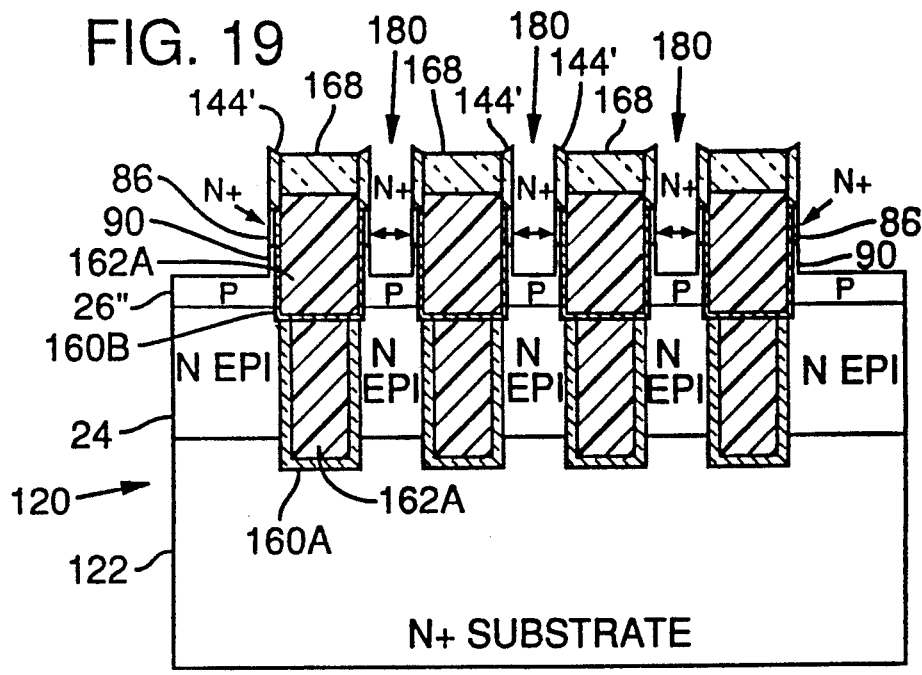

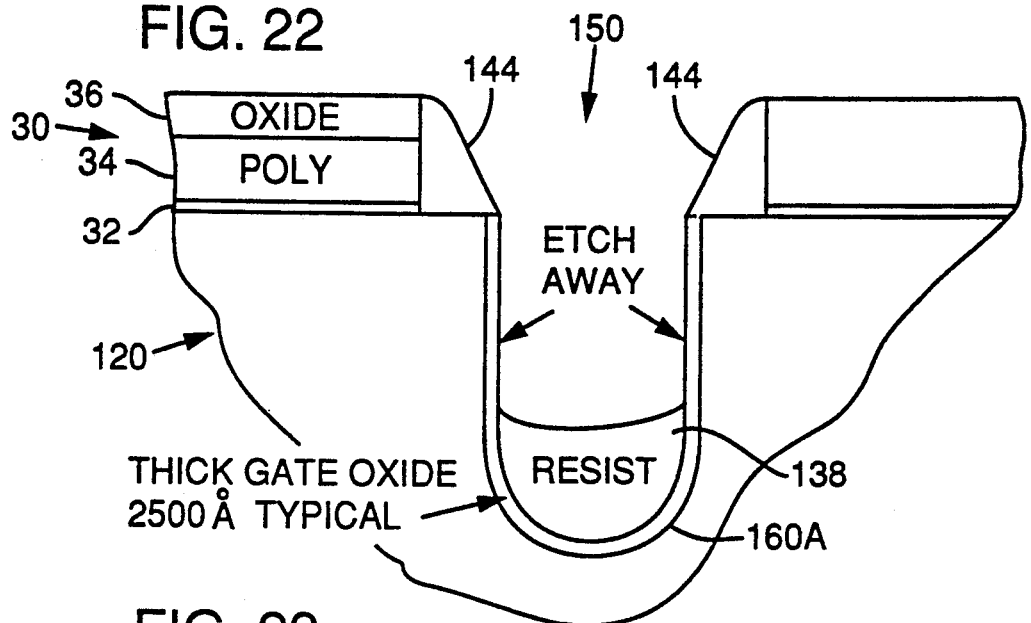
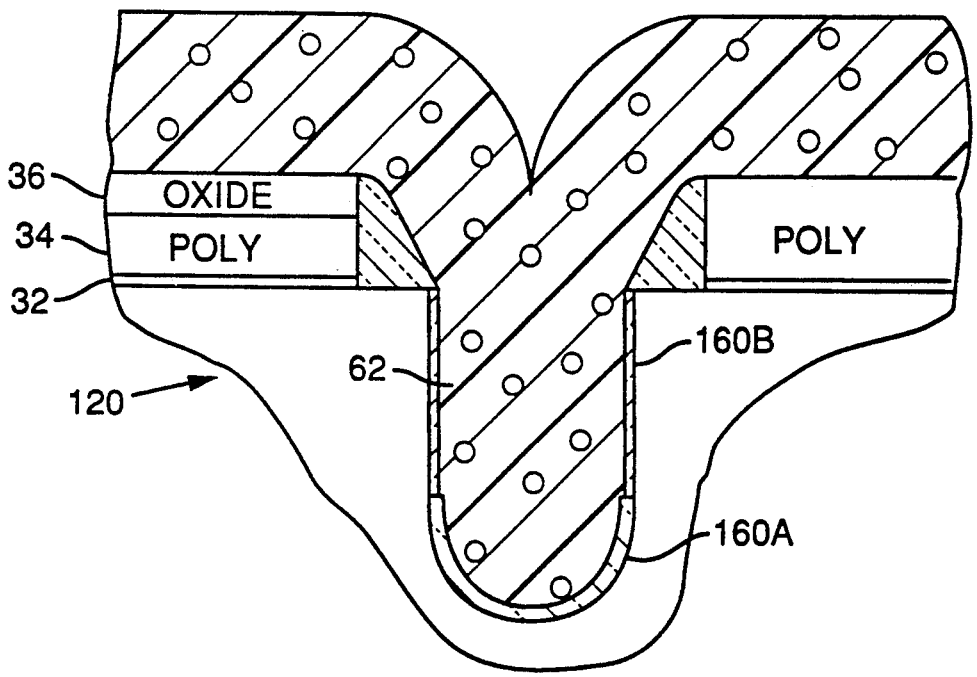
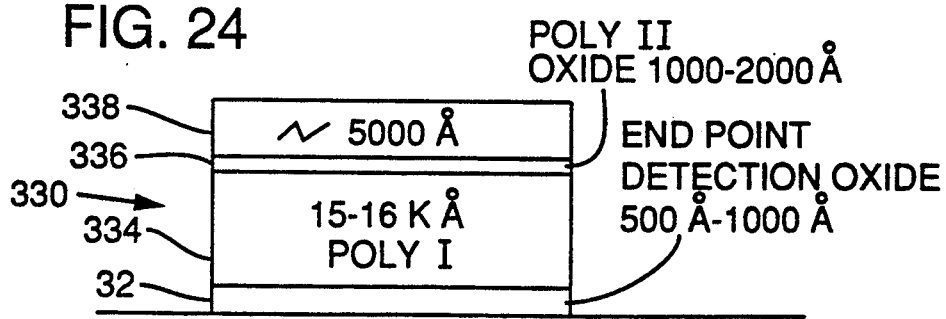

HIGH DENSITY POWER DEVICE FABRICATION PROCESS

This application is a continuation-in-part of commonly-assigned copending U.S. Ser. No. 07/852,932, filed Mar. 13, 1992, as a continuation of U.S. Ser. No. 07/751,441, filed Aug. 28, 1991, now abandoned, and of U.S. Ser. No. 07/737,560, filed Jul. 26, 1991, now U.S. Pat. No. 5,182,234, as a continuation of U.S. Ser. No. 07/467,636, filed Jan. 19, 1990, now abandoned, a division of U.S. Ser. No. 07/194,874, filed May 17, 1988, now U.S. Pat. No. 4,895,810, issued Jan. 23, 1990.

BACKGROUND OF INVENTION

This invention relates generally to power MOS field-effect devices, which includes power MOSFETs, insulated gate bipolar transistors (IGBT), MOS controlled thyristors and the like, and more particularly to recessed gate, rectangular-grooved or U-grooved power MOS field effect devices, commonly referred to as RMOSFETs or UMOSFETs.

Power MOSFETs have been recognized as provided a number of advantages over power bipolar transistors, particularly in regard to fast switching response, high input impedance and high thermal stability. A major disadvantage of power MOSFETs is their large ON-resistance and forward voltage drop compared to bipolar transistors. Significant efforts have gone into reducing the ON-resistance per unit area. These efforts include reducing the cell size of the devices to increase cell density, but the ability to do this in conventional VDMOS devices is limited by the presence of a parasitic junction FET between adjacent cells which increases ON-resistance as the device structure is scaled to smaller cell sizes. K. Shenai, "Optimally Scaled Low-Voltage Vertical Power MOSFET's for High Frequency Power Conversion" *IEEE Trans, on Electron Devices*, Vol. 37, No. 2, April, 1990 describes how the VDMOS device structure, having the gate and channel extending horizontally along the top surface of the semiconductor substrate, is inherently limited in density, necessitating other measures to reduce ON-resistance.

To avoid this inherent limitation, another class of power MOS field-effect devices has been developed using a recessed gate, in which the gate and channel are formed vertically along a sidewall of a channel or trench etched in the semiconductor substrate. These devices include rectangular-grooved or U-grooved power MOS field effect devices, commonly referred to as RMOSFETs or UMOSFETs. An early device of this type appears in U.S. Pat. No. 4,070,690 to Wickstrom. The source, channel and drain are formed by successive layers deposited on a substrate and trenched through for gate oxide formation and gate metal deposition on sidewalls of the trench. A variation of this approach, called the VMOS, is shown in U.S. Pat. No. 4,145,703 to Blanchard et al. Subsequently, it was recognized that the vertical channel orientation in this type of device could be scaled down to increase cell density without parasitic junction FET effects and thereby reduce ON-resistance below the inherent limitations of VDMOS devices. (see D. Ueda et al. "A New Vertical Power MOSFET Structure with Extremely Reduced On-Resistance" *IEEE Trans. on Electron Devices*, Vol. 32, No. 1, January, 1985) Further development of recessed gate technology is summarized below based on references listed at the end of the detailed description.

The usual starting material is a N+ wafer with a <100> oriented N epitaxial layer of a resistivity and thickness in the ranges of 0.1-1.0 ohm-cm and 5-10 um for low voltage MOSFETs to achieve a breakdown voltage of 15-55 V using rectangular striped grooves. This voltage range can be changed by adjusting untrenched P-base width, trench depth and width, and epi-layer doping. The N+ substrate can be replaced by a P+ substrate to make IGBTs as in DMOS technology.

A blanket P-type implant into the top surface of the epitaxial layer is dill used to 1.5-2.0 um depth to form a P-type body region. A first mask can be used at this stage to define N+ source regions.

An oxide layer is thermally grown and a trenching protective layer of silicon nitride (or LPCVD oxide, polySi/SiNi/oxide or other layer resistant to Si etching) is deposited to protect P-body/N-source regions from trenching.

Regions to be trenched are photomasked, at right angles to the source regions if they have been defined previously, and the trenching protective layer is etched. Reactive ion etching (RIE) is then used to form the gate trenches, typically to a depth of 2 um but variable as discussed below. Reactive ion etching can damage the substrate surface, causing high surface charge and low surface mobility. Chemical etching and sacrificial oxidation/etching steps are typically performed to restore surface mobility and channel conductance.

Gate oxide of 500-2000Å is regrown in the trench, and ~6000 Å thick polysilicon is deposited in the trench and doped to a sheet resistance of about 20 ohm/□. A second polysilicon layer is deposited to planarize the surface and etched back to clear the trenching protective layer. The trenching protective layer can be used in a self-aligned LOCOS (Localized Oxidation of Silicon) step to selectively oxidize and isolate the polysilicon gate structures from the P-body/N-source regions. The maximum LOCOS film thickness is limited by minimum linewidth because of "birds beak" sidewalll oxidation encroachment. With a 2 um/2 um minimum gate/source design rule, this layer cannot be much greater than 1 um thick or the source region will be completely sealed off by LOCOS encroachment. The LOCOS process further induces stress immediately surrounding the selective oxidation zone, wherein the MOS channel is formed, reducing surface mobility and increasing channel resistance.

If the source region has not already been defined, another photomasking step is performed to introduce the N-type source regions into the P-body contact regions, usually with a striped geometry perpendicular to the trench sidewalls, to effect distinctive P and N dopings at the top surface of the silicon, to short the P-body to the N+ source regions (10). This technique produces pinched P-base regions which are of wide dimensions, typically 2 um or more, and must be meticulously controlled in the photolithographic process. This step causes loss of channel width wherever N+ source is absent and reduces device ruggedness.

In one approach (2, 5, 10-FIG. 10), to improve packing density and more tightly control the lateral extent of the pinched B-base and avoid photolithographic control, lateral N+ diffusions are made from the windows formed in the trenching protective layer prior to trenching. In this approach, the P and N+ diffusions are fully diffused before gate oxidation, without partitioning the respective diffusion times to allow part of the diffusion cycles to be used for annealing RIE- and LOCOS-induced surface stress and defects. Also in this approach, contacts are made on lighter doped N+ diffusions, increasing series resistance of the device. A tradeoff is required between pinched base resistance and source contact resistance. There is a lower limit to how small the lateral diffusions can be made and consistently opened up after the LOCOS gate polysilicon oxidation due to "birds beak" formation. A dimension anywhere between 50% and 80% of the polysilicon LOCOS oxide thickness may not be available for a source contact of highest doping.

Another approach is to form a second trench through the N-source layer down to the P-body to receive source metal. This trench can be patterned by a separate photomasking step (1) but this approach is subject to critical alignment and size conditions. A self-aligned approach (11) depends on the ability to control both formation of the LOCOS oxide layer used to self-align this trenching step and to control the etching process itself. As noted above, "birds beak" formation can seal off the area to be trenched.

Once the basic recessed gate structure is formed, gate vias are opened to allow metal connections to the gate electrode in a self-aligned process. Frontside metal is deposited and patterned to delineate the gate and source (cathode) electrodes. Passivation deposition and pad patterning seal the device surface and open up the bonding pads. The backside of the silicon wafer is metallized to form the drain (anode) electrode.

Ueda et al have demonstrated that the lowest ON-resistance ($R_{ON}$) is achievable in a device in which the gate is trenched all the way through the N-epitaxial layer to the substrate (2). Unfortunately this approach also demonstrates a monotonic decrease in breakdown voltage as trench depth is increased. This decrease is due to reduction of the epi-layer thickness below the trench and higher electric field at the corners of the trench (7). Another problem with the deep trench is that the gate oxide might rupture at the corner of the trench because of high field intensity (7). The breakdown voltage is generally divided between gate oxides and depleted silicon. As trench depth is increased, the thickness of silicon under the trench is reduced, shifting more of the gate-drain voltage to the gate oxide and increasing the likelihood that the oxide layer will rupture. Thickening the gate oxide will improve the gate rupture resistance of the oxide layer but also increases channel resistance.

Accordingly, a need remains for a better fabrication method and structure for a vertical channel field effect MOS power device.

SUMMARY OF INVENTION

One object of the invention is to avoid the uncertainties and difficulties of photolithography and LOCOS layer formation in forming the functional areas of recessed gate field effect power MOS device.

Another object is to facilitate P-body and N-source shorting without having to trade off series source resistance against vertical channel resistance in a recessed gate field effect power MOS device.

A further object of the invention is to avoid LOCOS induced stress in silicon to increase the yield of functional recessed gate field effect power MOS devices.

The invention is a recessed gate field effect power MOS device structure and fabrication process which are improved in several aspects.

One aspect is the use of a sidewall spacer on the trenching protective layer in a self-aligned process to control lateral extent of the pinched P-base width. Improved ruggedness of the device and an effective doubling of channel width over prior art are achieved. The sidewall spacer is formed by deposition and etching to define the spacer width, thus avoiding the uncertainties and difficulties of photolithography and LOCOS layer formation in defining the N+ source region.

Another aspect of the invention is that the trenching protective layer is formed by using an oxide (or oxynitride) layer on a polysilicon layer on thin thermal oxide, instead of SiNi on oxide. No LOCOS step is needed in this method. The top oxide layer provides selective protection against silicon trench etching and polysilicon gate etching, preferably by $SF_6$-$O_2$ plasma etching. In one embodiment, the oxide layer is preferably ~5000 Å thick but can be 2000-8000Å thick depending on trench depth, gate polysilicon thickness and the etch rate selectivity between silicon and oxide. The 5000Å oxide film is sufficient to block 2-5 um of silicon trenching plus additional margin for gate polysilicon etching. The polysilicon layer in this embodiment is preferably 1000-3000Å thick and is used to protect the future source region, to support the sidewall spacers, and to enable the deposition and complete isolation of gate polysilicon. The lower oxide layer is preferably ~500Å thick (range of 500 to 1000Å thick) and serves as an etch stop under the polysilicon layer. A second embodiment uses a polysilicon layer preferably formed in a double layer with an intermediate etch-stop oxide layer below a sacrificial top polysilicon layer. In this embodiment, the lower polysilicon layer is thicker (e.g., 15000-16000Å), the intermediate etch-stop oxide layer is thinner (e.g., 1000-2000Å) and is covered by a polysilicon layer of about 5000Å.

A further aspect of the invention is the introduction of a second trench in the body region to create source contacts on the trench sidewalls and body contacts on the trench sidewalls and bottom wall. Doing this with sidewall spacers provides self-alignment without the drawbacks of LOCOS formation. This approach thus produces a field effect power MOS device with a recessed source as well as a recessed gate. This structure is highly advantageous in switching inductive loads as it will shunt substantial reverse currents directly to the source contacts, which are preferably metal conductors. This structure also provide a very low resistance short between the body and source (base and emitter) to prevent reverse biasing of the body/source junction and minimize potential for latching of the parasitic NPN bipolar transistor formed by the source, body and drain regions. This is particularly advantageous if the device is fabricated on a P-type substrate to make an IGBT or other MOS gate-controlled four-layer device.

The foregoing and other objects, features and advantages of the invention will become more readily apparent from the following detailed description of a preferred embodiment which proceeds with reference to the accompanying drawings.

BRIEF DESCRIPTION OF DRAWINGS

FIGS. 1-12 are cross-sectional views of a portion of a silicon substrate showing fabrication of a recessed gate field effect power MOS device in accordance with a first embodiment of the invention.

FIGS. 14-20 are cross-sectional views corresponding roughly to FIGS. 5-12 showing fabrication of a recessed gate field effect power MOS device in accordance with a second embodiment of the invention with a double polysilicon gate structure which terminates depthwise within the N+ substrate.

FIGS. 22 and 23 are cross-sectional views corresponding roughly to FIGS. 16 and 17 showing fabrication of a recessed gate field effect power MOS device in accordance with a fourth embodiment of the invention.

FIG. 24 is a cross-sectional view corresponding to FIG. 3 showing an alternative form of the mask surrogate pattern definition layer.

DETAILED DESCRIPTION

Figure 5:
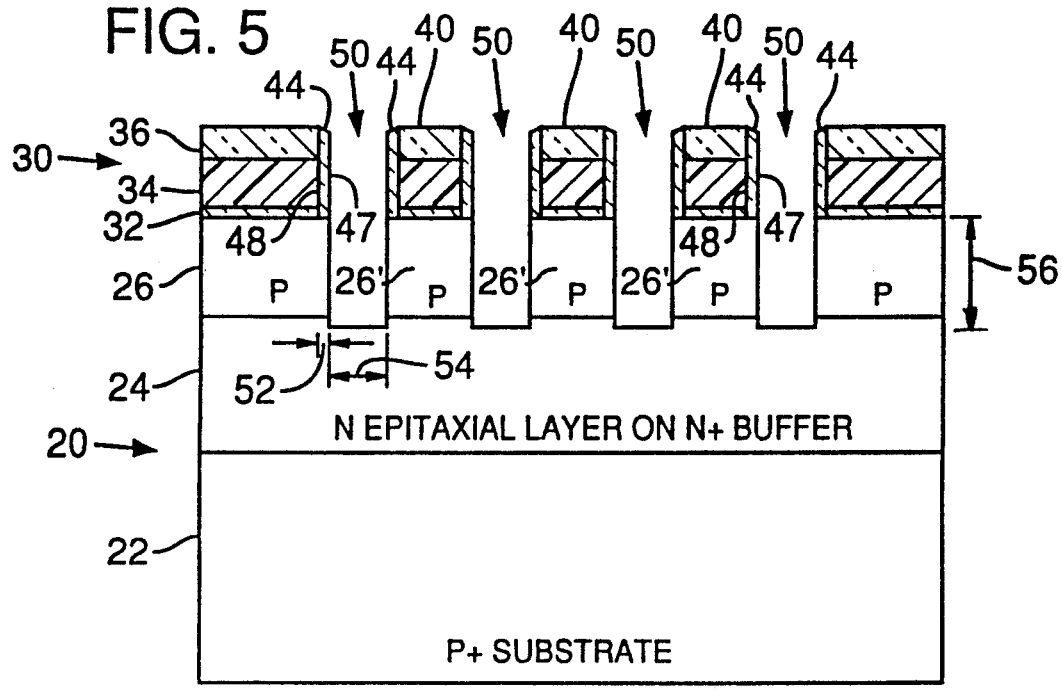

FIG. 1 is a cross-sectional view of a portion of a silicon substrate 20 on which beginning doped layers including body and drain regions have been formed to begin fabrication of a recessed gate field effect power MOS device in accordance with a first embodiment of the invention. The process starts by forming a <100> oriented N-type epitaxial layer 24 on a P+ wafer 22. This substrate will be used to make an IGBT-type four-layer device. An N+ wafer can be substituted to make a three-layer power MOSFET. Then, a P-type body layer 26 is formed either by implantation (e.g., boron) and diffusion to a 2-3 μm depth into the N-epitaxial layer or by deposition of a 2-3 μm P-epitaxial layer atop the N-epitaxial layer. The N-type epitaxial layer is doped to a concentration of about $10^{16} cm^{-3}$ (resistivity in the range of 0.1 to 1.0 Ω-cm) and has a thickness of 2 to 3 μm and the P-epitaxial layer is doped to a concentration of about $10^{17} cm^{-3}$ and has a thickness of 2 to 3 μm for low voltage (e.g., 60V) MOSFETs. The N-type epitaxial layer 24 includes an N+ buffer layer at the interface with the P-type substrate, as is known. For higher voltage devices, layers 24, 26 are generally more lightly doped and thicker, as described in commonly-assigned U.S. Ser. No. 07/852,932, filed Mar. 13, 1992, now U.S. Pat. No. 5,262,336 incorporated herein by this reference. For example, N-type layer 24 has a doping concentration of about $10^{14} cm^{-3}$ and a thickness of 85 μm and P-type layer 26 has a doping concentration of about $5 \times 10^{16} cm^{-3}$ for 1000V devices). Voltages can also be adjusted by varying the untrenched P-base width, trench depth and width, and epitaxial doping concentration.

FIG. 2 shows the further steps of forming a trenching protective or mask surrogate pattern definition layer 30 on the upper surface 28 of substrate 20. As shown in FIG. 2, layer 30 is a thin oxide/PolySi/thick oxide tri-layer structure. FIG. 24 shows an alternative four-layer structure further described below. Layer 30 is formed by a thin thermal oxide layer 32 on surface 28, a PECVD polysilicon layer 34, and a LPCVD thick oxide layer 36. The top oxide layer 36 provides selective protection against silicon trench etching and polysilicon gate etching, preferably by SF$_6$—O$_2$ plasma etching. In one embodiment, oxide layer 36 is preferably ~5000 Å thick but can be 1000-8000Å thick depending on trench depth, gate polysilicon thickness and the etch rate selectivity between silicon and oxide. The 5000Å oxide film is sufficient to block 2-5 μm of silicon trenching plus additional margin for gate polysilicon etching. The polysilicon layer 34 in this embodiment is preferably 1000-3000Å thick and is used to protect the future source region, to support the sidewall spacers, and to enable the deposition and complete isolation of gate polysilicon. The lower oxide layer 32 is preferably ~1000Å thick (range of 50014 2000Å thick) and serves as an etch stop under the polysilicon layer.

FIG. 3 shows the steps of masking and patterning the trenching protective layer. A photoresist layer 38 is applied over layer 30 and is patterned to define protected regions 40 and etched away regions 42 in layer 30 in successive etching steps of layers 36 and 34. Regions 42 and 40 can be stripes, a rectangular or hexagonal matrix, or other geometries of design. In a cellular design, regions 40 are discrete blocks or islands separated by interconnecting regions 42.

FIG. 4 shows the removal of photoresist layer 38 and formation of sidewall spacers 44 along opposite vertical sides of the pattern-defining trilayer regions 40.@The sidewall spacers 44 are formed using known procedures by a conformal LPCVD oxide layer, preferably of 0.5-1 μm thickness, which is reactive ion etched anisotropically. The spacer etch is controlled to end when substrate silicon is exposed in areas 46 of silicon substrate exposed between the sidewall spacers 44 within regions 42 so that the top oxide layer 36 is only slightly eroded. The spacers have a laterally exposed or outer face 47 and an inner face 48 contacting the sides of the pattern-defining regions 40 at this stage in the process.

FIG. 5 shows forming a trench 50 in the silicon substrate in each of the exposed areas 46. This first anisotropic etching step is accomplished by reactive-ion etching, preferably by SF$_6$—O$_2$ plasma etching as described in commonly-assigned U.S. Pat. No. 4,895,810 (see FIG. 13E), controlled to form a series of spaced trenches 50 in the substrate 20 with minimal damage to the silicon surface and straight vertical sides aligned with the outer faces 47 of the sidewall spacers. The spacing between the outer faces 47 of spacers 44 determines the width 54 of the trench 50 as a function of lateral thickness 52 of the spacers. Thickness 52 also partially determines the eventual lateral thickness of the source regions as formed in FIG. 11. In this embodiment, the depth 56 of the trench is sufficient (e.g., 2 μm) to penetrate through the P-type layer 26 just into an upper portion of the N-type layer 24. This step laterally isolates regions 26' of the P-type layer covered by the pattern-defining tri-layer regions 40. Regions 64 can be stripes in an interdigitated design or connecting network in a cellular design.

Figure 6:
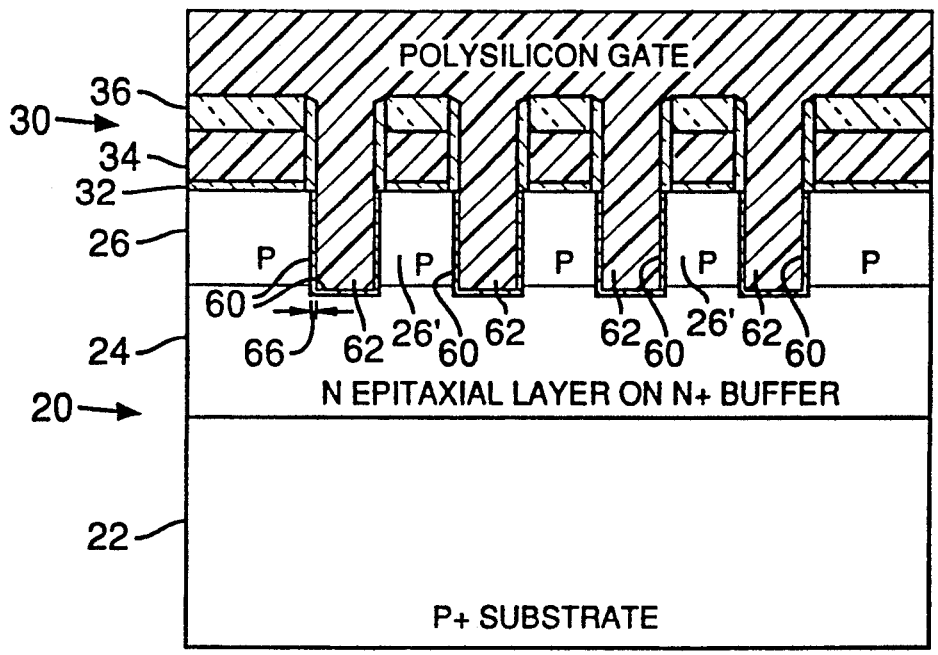

Following trenching, a thermal gate oxide layer 60 is grown, as shown in FIG. 6, on the trench side and bottom walls below the sidewall spacers. The gate oxide layer has a thickness 66 that is selected as needed to provide a punchthrough resistant gate dielectric, e.g., ~500Å. Then, the trench is refilled with LPCVD polysilicon gate material 62, extending into the trenches 50 and over trenching protective structures 40. The polysilicon gate material 62 is doped to about 20ΩO.

Figure 7:
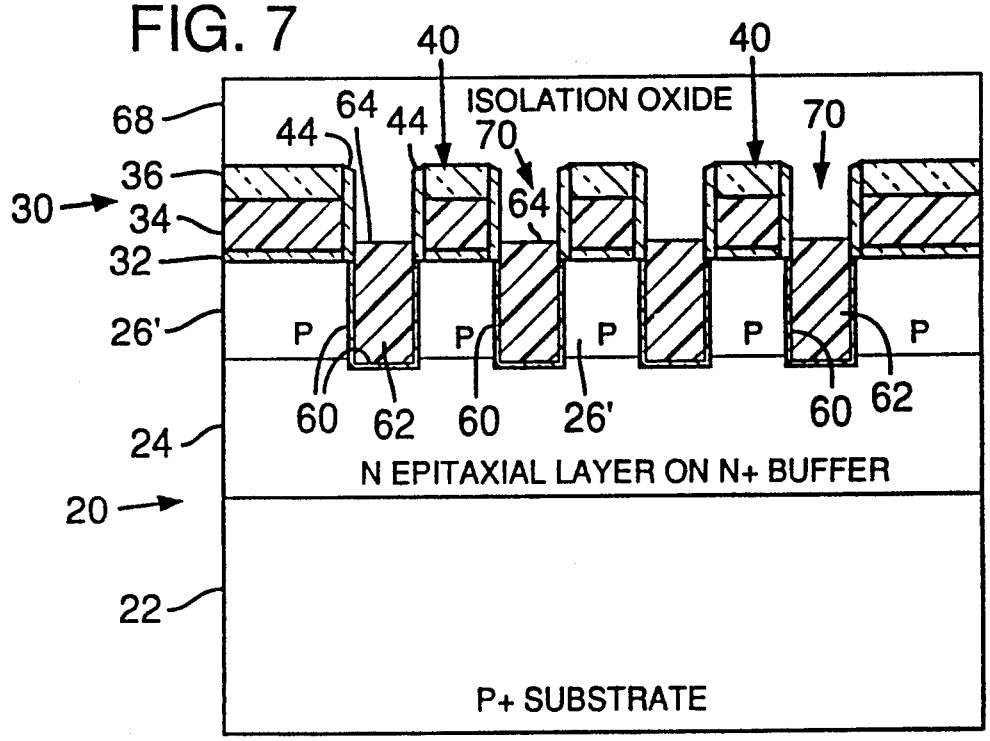

Referring to FIG. 7, a second anisotropic etch is next used to etch the polysilicon material 62 back to about the level of the original substrate surface, again exposing the trenching protective structures. This step leaves vertical trenches 70 between the sidewall spacers 44 like trenches 50 but ending at the upper surface 64 of the remaining polysilicon material 62. A silicide can be formed in the remaining polysilicon material at this step to further reduce gate resistance, for example, by refractory metal deposition and silicide formation. Then, a CVD oxide (or oxynitride) isolation layer 68 is deposited into the trenches 50 over the remaining polysilicon material 64 and over the trenching protective structures 40.

Figure 8:
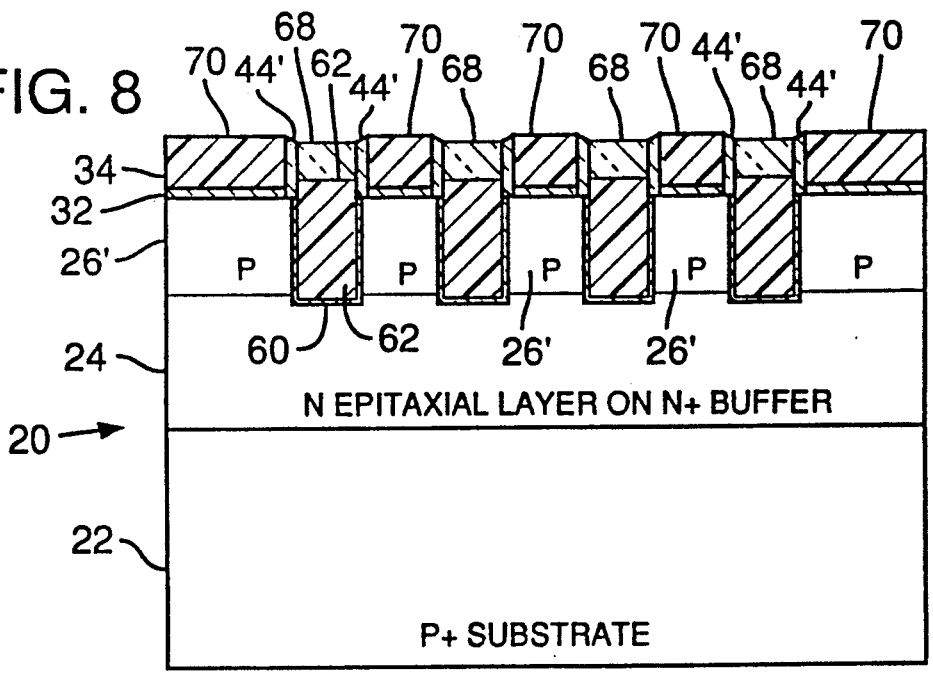
Figure 13:
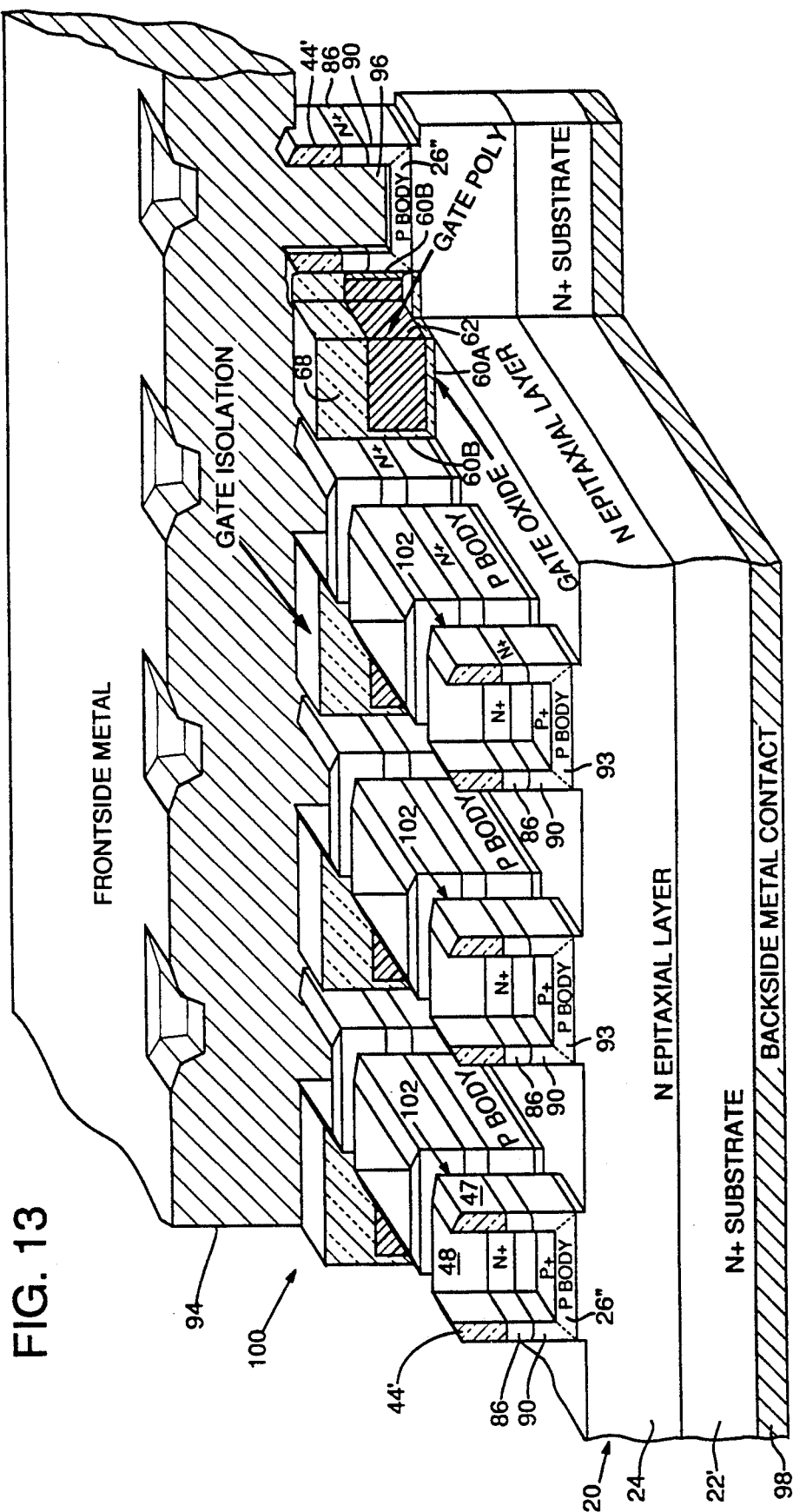
FIG. 13 is a perspective view of a device made by the process of FIGS. 1-12.

FIG. 8 shows the device after anisotropically etching off the upper portion of the isolation oxide 68 and the upper thick oxide layer 36 of the trenching protective layer 30. The etch stops when the top surface 70 of the original polysilicon layer is exposed, leaving oxide plugs 68 atop the surface 64 of polysilicon material 62 between shortened sidewall spacers 44'. At this stage, the top surface of the intermediate device appears in plan view as a series of alternating oxide and polysilicon stripes 68, 70, or as an interconnected region 68 with isolated regions 70 as shown in FIG. 13.

Figure 9:
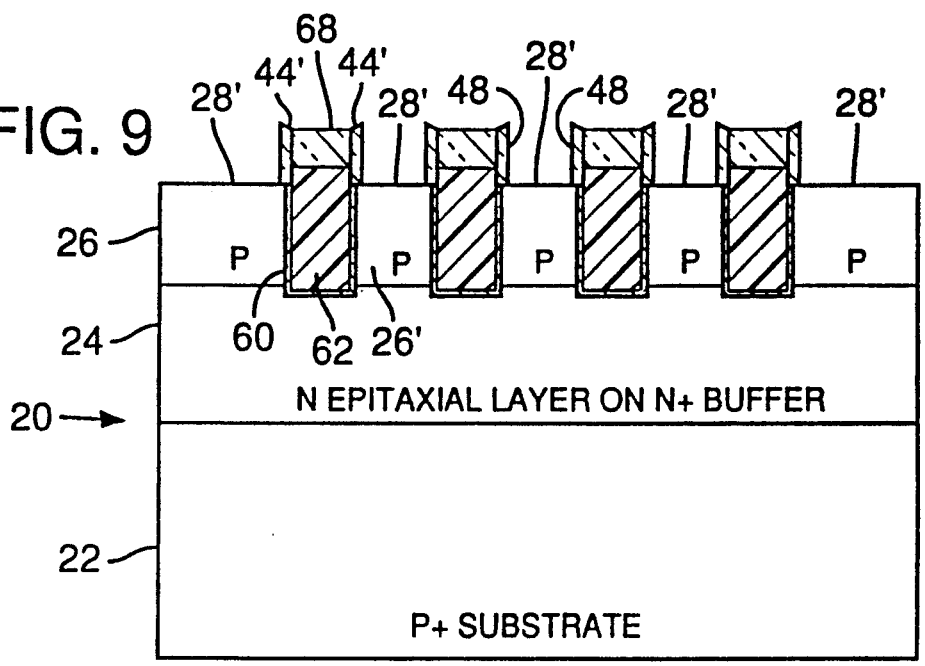

FIG. 9 shows the further steps of etching away the original polysilicon layer 34 followed by etching away the thin lower oxide layer 32 of the trenching protective layer 30 to expose the original substrate surface 28, which now appears as stripes 28' or isolated zones, exposed between the sidewall spacers 44' which now appear on opposite sides of oxide plugs 68.

Figure 10:
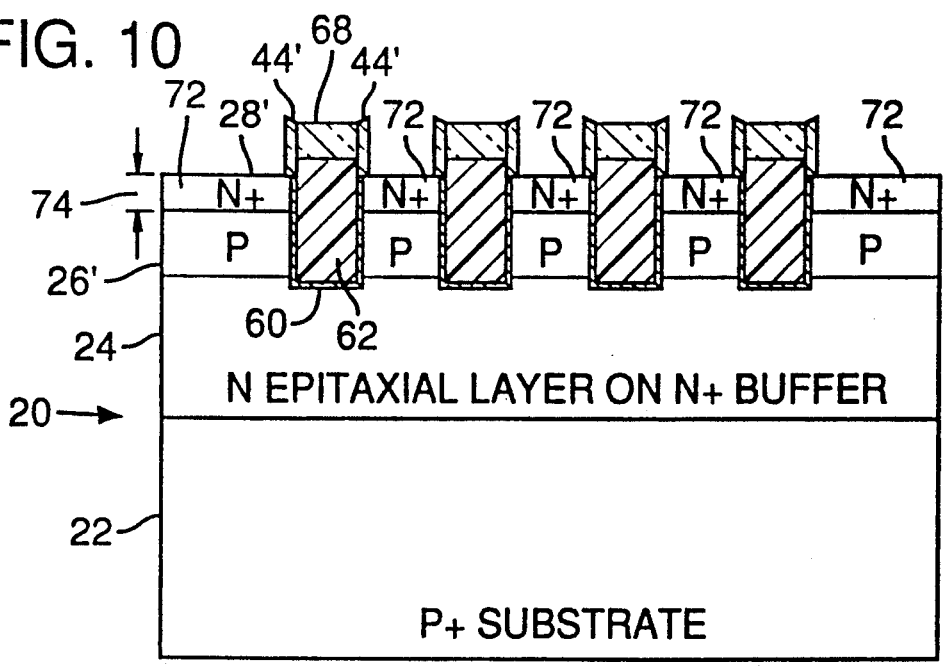

FIG. 10 shows diffusing N+ source regions 72 into an upper layer of exposed stripes of the substrate just beneath the original substrate surface 28'. This is preferably done by shallowly implanting a dose of about $5 \times 10^{15}$ cm$^{-2}$ of arsenic or phosphorus atoms, and heat treating to activate the implant. The resulting source region 72 should be diffused to a depth 74 of about 1 μm or slightly less. This step could be performed alternatively by gaseous diffusion. It could also be performed earlier in the process, e.g., after forming the P-type body layer in FIG. 1. The above described sequence and method are preferred, however, as giving more control over MOSFET channel length as further described below.

Figure 11:
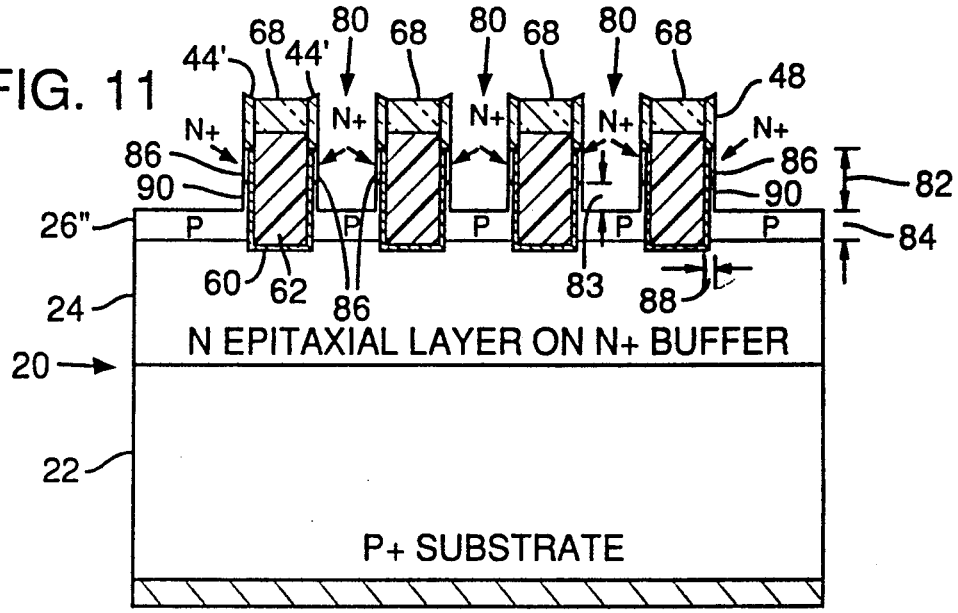

Next, referring to FIG. 11, a second anisotropic etch of the substrate silicon is performed to form a second trench 80 in the substrate material between the sidewalls 44' and gate isolation oxide plugs 68 enclosing the gate polysilicon material 62 and gate oxide layers 60. The etching technique used is preferably by SF$_6$—O$_2$ plasma etching, as noted above, to form the trenches with straight vertical sides aligned with the now exposed inner faces 48 of the sidewall spacers. The trench depth 82 is at least 1 μm so as to penetrate at least through the N+ diffusion and a portion of the P layer 26 but less than original thickness of layer 26 so that a P+ layer with thickness 84 of about 1 μm remains at the base of trench 80. As a result of this step, the N+ region is reduced to vertically oriented N+ source layers 86 having a lateral thickness 88 that is approximately equal to the difference between the thickness 52 of the sidewall spacers (see FIG. 5) and about half of the thickness 66 of the gate oxide layer (see FIG. 6). For a sidewall spacer thickness 52 of about 1 μm and a gate oxide thickness of ~500 Å, the N+ layer has a lateral thickness of ≦1 μm, e.g. ~9750Å. For a sidewall spacer thickness 52 of about 0.5 μm and a gate oxide thickness of ~500 Å, the N+ layer has a lateral thickness of ≦0.5 μm, e.g. ~4750Å.

The N+ source layers 86 each sit atop a thin vertically-oriented layer 90 of P substrate material, which provides the active body region in which a vertical channel of the MOSFET device is formed when the gate is suitably biased. This channel exists on all sides of the gate structure. The depth 74 of the N+ implant (FIG. 10) and the depth of the P diffusion 26 determine the ultimate vertical MOSFET channel length of the device. A typical channel length of about 1-2 μm is produced using the dimension disclosed herein, but can readily be altered as needed to define the MOSFET device switching characteristics. The overall vertical height 83 of the P layer must be sufficient to avoid punchthrough, suitably 1-2 μm at the P doping concentrations provided herein. The lateral thickness of the P layer 90 provides a very short lateral pinched P-base controlled by sidewall spacer thickness. If the sidewalls of the trench are strictly vertical, the active body region 90 has a similar lateral thickness to that of the N+ layer, 18 5000 Å. In practice, the body region 90 lateral thickness can vary slightly from that of the N+ layer. The key point is that lateral thickness of both layers 86, 90 can be controlled by controlling the lateral thickness of either the gate oxide layer 60 or the sidewall spacers 44, or both. Another key point is, that by using this method the pinched base can be made much narrower than in conventional lateral channel VDMOS devices, which typically have a pinched base width of 3-4 μm.

Optionally albeit preferably, a second, shallow P-type implant and anneal can be performed at this stage to provide an enhanced P+ conduction region 93 (see FIG. 13) in the remaining P-type layer 26" at the base of the trench 80, as described in commonly-assigned U.S. Pat. No. 4,895,810 (see FIGS. 13D and 14), incorporated herein by this reference. This can further improve source metal contact to the P-body and reduce pinched-base resistance in a totally self-aligned manner without materially affecting threshold doping of the active channel region that remains in layer 90 after forming the gate oxide layer 60.

Figure 12:
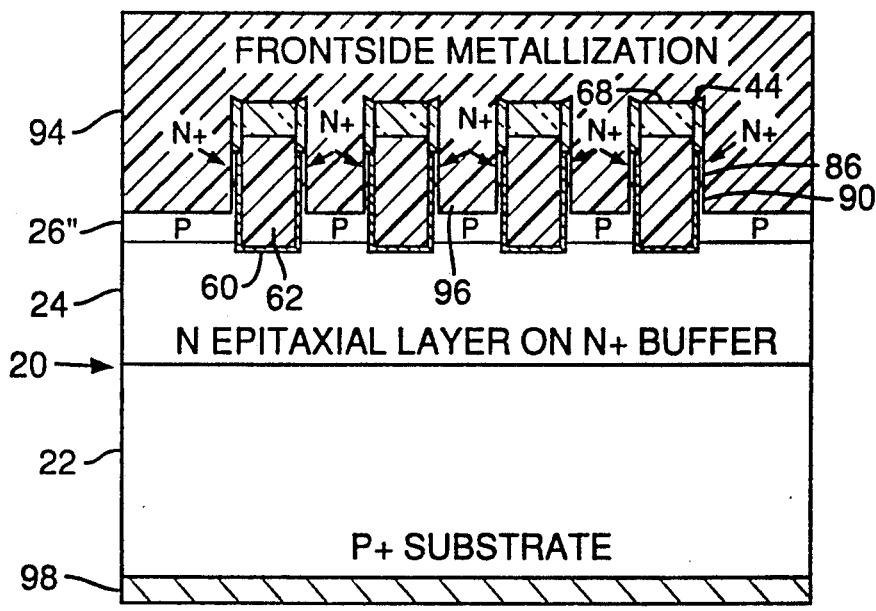

The remainder of the process generally follows prior art methods and so is only generally described. FIG. 12 is a cross-sectional view showing frontside and backside metallization 94, 98. The frontside metal 94 extends downward into the trenches 80 to form conductive source contacts or fingers 96 which vertically short the source and body layers 86, 90 together as well as contact the top surface of the remaining P-type layer 26" at the bottom of the trench. The backside metal 98 forms the drain contact or cathode. The completion steps also include opening gate contact vias at discrete locations, which can be done in this process without critical alignment, and passivating the surface.

The foregoing method has several advantages over prior art methods. The N and P-type contact areas are created without a mask. The channel area is increased The pinched P-body width lateral width is reduced. The overall device has a higher packing density from savings of surface area due to formation of the source contacts on the trench sidewalls. The device has lower resistance due to higher surface mobility resulting from the low stress process.

FIG. 13 is a perspective and partially-sectioned view of a device 100 made by the process of FIGS. 1-12 but using an N+ wafer 22' to make a three-layer power MOSFET rather than a four-layer device. Having already described the method of fabrication in detail, the resulting device is only described generally, using the same reference numerals wherever applicable. In this perspective view, the isolated source and P-body structures are confined within discrete islands separated by an interconnecting crisscross pattern or matrix gate structure. Other array arrangements, such as arranging the source blocks in a hexagonal geometry, can be done as well. A cellular design with isolated source islands surrounded by a gate mesh in a trench can significantly reduce gate resistance, an important factor in very large area devices. The result is a castellated structure of rectangular device cells 102, each receiving a downward protruding finger 96 of source metal, and separated from one another by a contiguous matrix of recessed gate structure 60, 62, 68 as shown in FIG. 13.

The device 100 has a silicon substrate 20 including a silicon wafer 22 (P+ as in FIGS. 1-12) or 22' (N+ in FIG. 13) with, successively, an N-type epitaxial layer 24 forming a drain or drift region and a P-type layer 26" forming a body or base region. The P-type region includes castellated vertical P-type layers 90 in which the active channels are formed. Atop the vertical P-type layers 90 are vertically aligned vertical N-type layers 86 which form the source regions of the MOSFET device. Atop the vertical N-type layers 86 are vertically aligned spacers 44' which serve together with oxide plugs 68 in the final device to isolate the source metal 94 from the gate polysilicon 62. The gate polysilicon material 62 is isolated vertically from upper surface of substrate layer 24 by a horizontal portion 60A of gate oxide layer 60 extending beneath the gate polysilicon and laterally from the vertically aligned vertical N-type and P-type layers 86, 90 by a vertical portion 60B of gate oxide layer 60.

FIGS. 14-20 show a second embodiment of the invention in which a recessed gate field effect power MOSFET device is fabricated with a gate structure, formed by a double polysilicon structure separated by oxide, which terminates depthwise in substrate 120 within an N+ wafer layer 122. The purpose of this modification is to achieve the lowest possible on-resistance in a power MOSFET without losing voltage blocking capacity. This modification to the process uses the same steps as shown in FIGS. 1-4 with an N+ substrate 122 and the same features are identified with the same reference numerals. Except as stated below, the process details are like those described above in the first embodiment.

Figure 14:
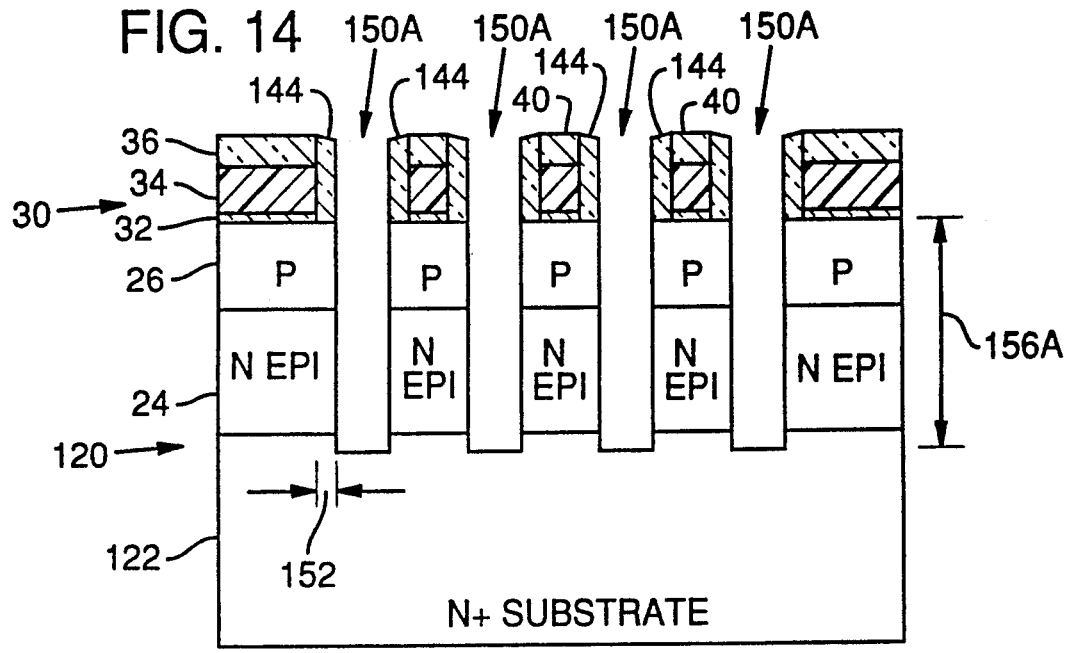

FIG. 14 is a cross-sectional view corresponding to FIG. 5 except that the sidewall spacers 144 have a greater thickness 152, e.g., 0.8 to 1.0 μm vs. ≦0.5 μm for the first embodiment, or are made of oxynitride or other silicon-etch resistant material to tolerate longer etching, and the trenches 150A between the sidewall spacers are anisotropically etched to a depth 156A (e.g., 5-6 μm for a 60V device) through the epitaxial layer 24 to the N+ silicon wafer layer 122.

Figure 15:
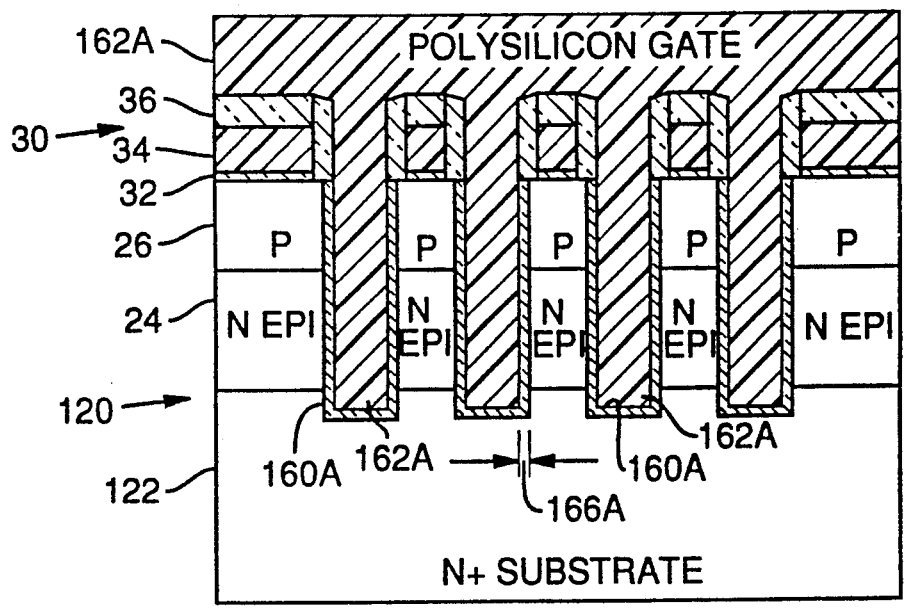

FIG. 15 corresponds to FIG. 6 and shows the formation of a thick oxide layer 160A on the deep trench surfaces and a deep LPCVD polysilicon filler 162A into the trenches 150A and over the trenching protective structures 30. The oxide layer 160A in this example has a thickness 166A of 2000 to 3000Å. This first gate polysilicon layer 162A can but need not be doped.

Figure 16:
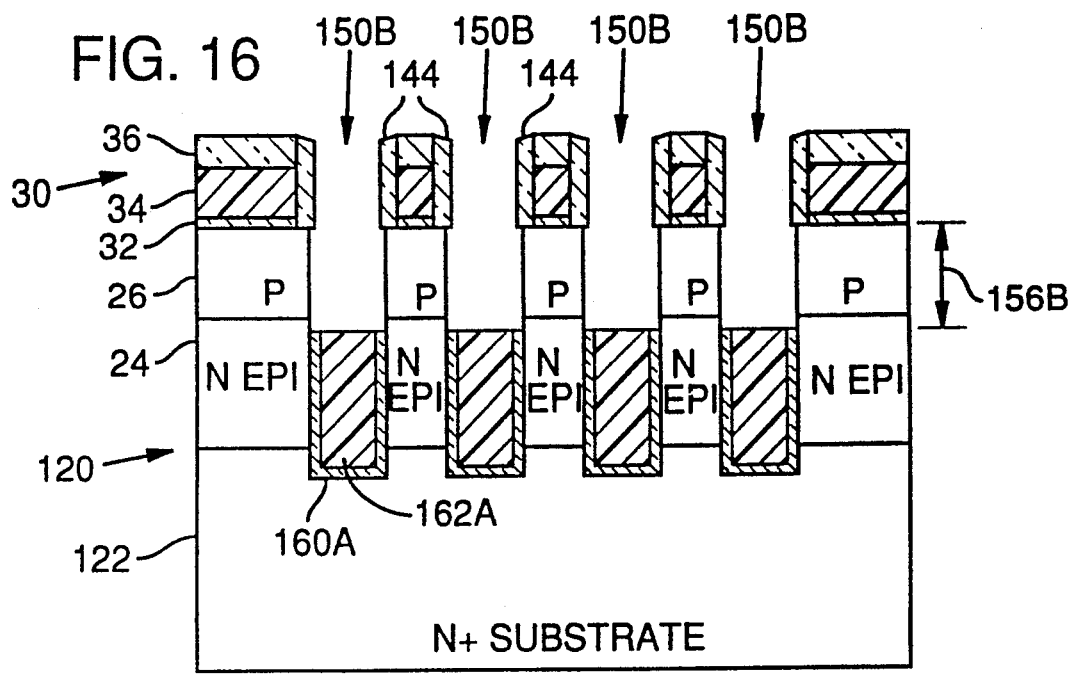

FIG. 16 shows the further steps of etching the polysilicon layer 162A and thick oxide layer 160A downward to a level slightly below the P-body region 26, as indicated by arrow 156B. What remains is a shallower trench 150B with a depth 156B comparable to depth 56 of trench 50 in FIG. 5. The polysilicon layer 162A is anisotropically etched to a level slightly below the final P-body junction depth, giving a trench 150B of depth 156B above the first polysilicon approximately equal to the polysilicon thickness in the trilayer film 30 and the P-body thickness. The thick oxide is then etched off the sidewalls of the trench 150B wherever it is not protected by the remaining polysilicon 162A.

Figure 17:
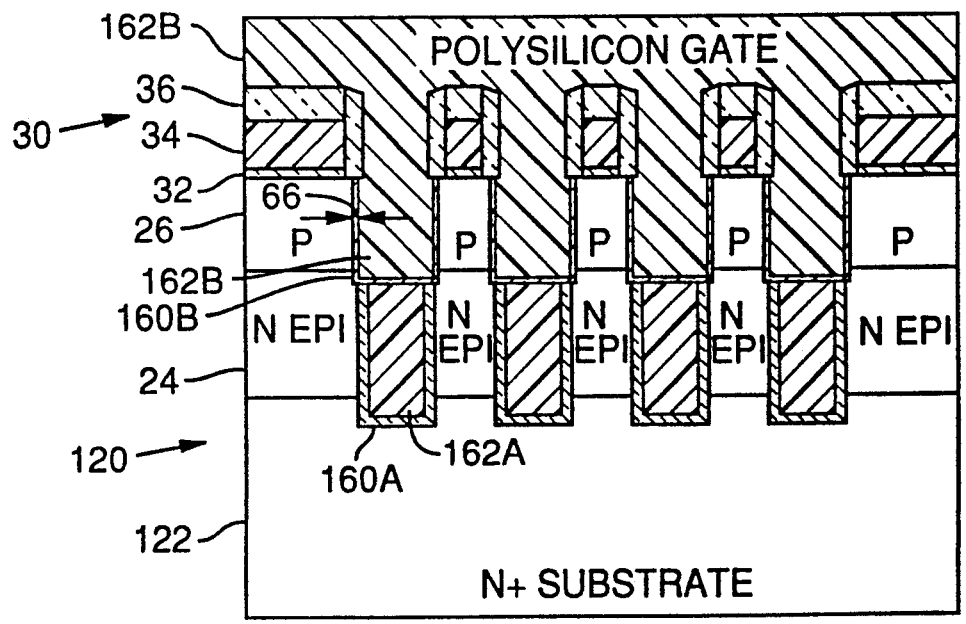

Next, as shown in FIG. 17, a thin gate oxide layer 160B is thermally regrown on the reduced depth trench sidewalls and the upper surface of the deep polysilicon filler to a thickness 66 as in the first embodiment. Then, doped gate polysilicon 162B is deposited into the trenches 150B atop oxide layer 160B and over trenching protective structures 30.

FIG. 18 is a cross-sectional view corresponding to FIG. 7 showing the 4, further steps of etching the polysilicon to a level about the level of the original substrate surface and depositing isolation oxide 68 into the trenches 150B and over the trenching protective structures. These steps are followed by steps like those shown in FIGS. 8-10 above.

Figure 20:
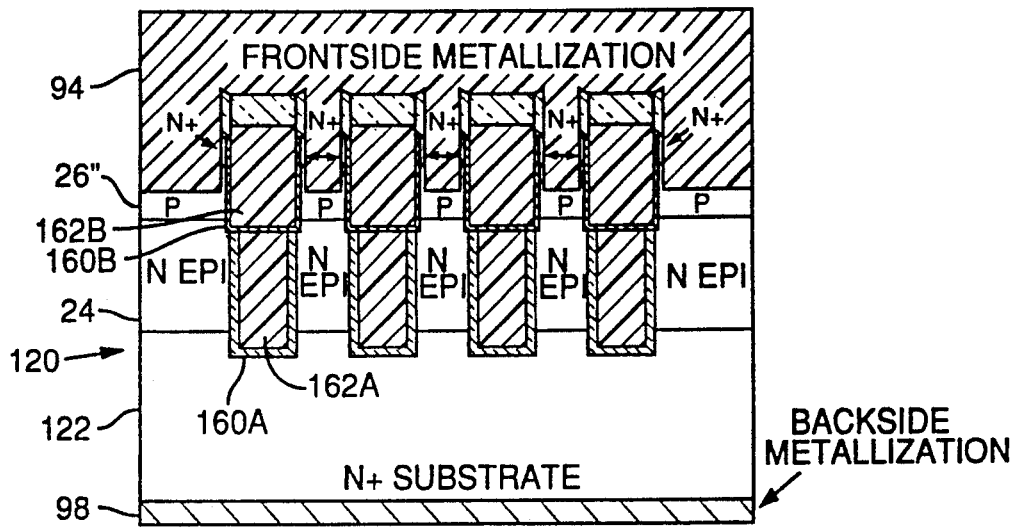

FIGS. 19 and 20 are cross-sectional views corresponding to FIGS. 11 and 12 showing the further steps of forming the second trench and metallization in a device with the double polysilicon gate structure developed in FIGS. 14-18. Trenches 180 are formed in the N+ source regions between the sidewalls 144' and gate isolation oxide plugs 168 enclosing the gate polysilicon material 162B and gate oxide layers 160B. The N+ region is reduced to vertically oriented N+ source layers 86 having a lateral thickness 88 atop vertical P-type layers 90 as described above at FIG. 11.

The prior art problem of losing breakdown voltage range when the trench depth reaches the substrate is eliminated by the presence of the thicker first gate oxide 160A. The thicker gate oxide layer shifts the gatedrain voltage drop from silicon to oxide. At the same time, the second thinner gate oxide preserves the enhancement mode MOSFET channel conductance. Conductance exceeding the first embodiment and prior art designs can be achieved with minimal additional processing steps.

Figure 21:
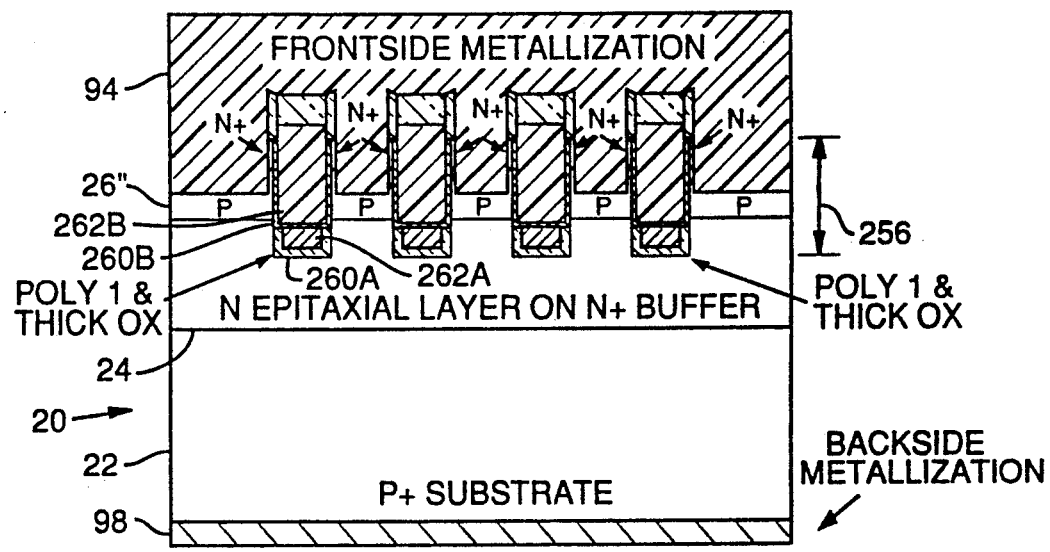
FIG. 21 is a cross-sectional view corresponding to FIGS. 12 and 20 showing fabrication of a device in accordance with a third embodiment of the invention with a double polysilicon gate structure which terminates depthwise within the N-type epitaxial layer above an N+ buffer layer formed on a P+ substrate to operate as an IGBT.

FIG. 21 is a cross-sectional view corresponding to FIGS. 12 and 20 showing a third embodiment of the method of fabrication of a device with a double polysilicon gate structure to provide protection against gate oxide rupture for high voltage devices while thin sidewall oxide preserves channel conductivity. In this example, the double polysilicon gate structure has a first thick oxide layer 260A and polysilicon layer 262A formed in a trench having a depth 256 (e.g., 3 μm) greater than depth 56 of trench 50 but shallower than the depth 156 of trench 150. The trench in this case terminates depthwise in substrate 20 within the N-type epitaxial layer 24 above an N+ buffer formed on a P+ wafer layer 22 to operate as an IGBT or other gate controlled four-layer device. In this embodiment as well as the first embodiment, the narrowest lateral dimension of region 40 (FIG. 3) that photolithography can control is used to minimize trench corner field and optimize breakdown voltage.

FIGS. 22 and 23 are cross-sectional views corresponding roughly to FIGS. 16 and 17 showing fabrication of a recessed gate field effect power MOS device in accordance with a fourth embodiment of the invention.

In this embodiment, as in the second and third, an initial thick (~2500Å) layer 160A of thermal oxide is formed on the sidewalls and bottom wall of trench 150. Then, rather than using filled and etched-back polysilicon, photoresist 138 is pooled in the bottom of the trench 150 and, when hardened, is used to protect the initial thick oxide layer in the lower portion of the trench while the sidewall portions of layer 160A are etched away. Next, after using known solvents to strip the photoresist 138, gate oxide 160B is regrown on the trench sidewalls above oxide 160A to a suitable thickness (~500-1000Å) as previously described at FIG. 17. Then, doped polysilicon gate material 62 is deposited as described above at FIG. 6, and the remainder of the device is completed by the steps shown in FIGS. 18-21. The approach shown in FIGS. 22 and 23 is simpler than the double polysilicon structure of FIGS. 14-17, and accomplishes essentially the same result.

FIG. 24 is a cross-sectional view corresponding to FIG. 3 showing an alternative form of the mask surrogate pattern definition layer 330. The protective layer 330 has, atop initial oxide layer 32, a polysilicon multilayer structure preferably including two polysilicon layers with an intermediate etch-stop oxide layer. In this embodiment, the lower polysilicon lay thicker (e.g., 15000-16000Å) than layer 34, the intermediate etch-stop oxide layer 336 is thinner (e.g., 1000-2000Å) than layer 36 and is covered by a polysilicon layer 338 of about 5000Å. The top polysilicon layer 338 is a sacrificial layer to be removed when trench 50 is formed, using oxide layer 336 as an etch stop. The top surface of lower polysilicon layer 334 indicates an endpoint for the etching the isolation oxide layer (FIGS. 7 and 8) to produce plugs 68. The thickness of polysilicon layer 334 determines the height down to which plug 68 is etched. Layer 334 is removed using oxide layer 32 for etching end point detection, and then layer 32 is removed prior to N+ implantation and the second trenching step.

Having described and illustrated the principles of the invention in a preferred embodiment thereof, it should be apparent that the invention can be modified in arrangement and detail without departing from such principles. For example, it is not necessary to form the second trench and vertical channel structures throughout the device. A portion of the device upper surface could be masked off at appropriate steps (e.g., at FIG. 1 and after FIG. 4) and this portion can be used in the manner described in the commonly-assigned patents to form a double-diffused lateral MOS device on part of the same die as the above-described recessed gate vertical channel device. This variation would be useful in making MOS controlled thyristors (MCT). We claim all modifications and variations coming within the spirit and scope of the following claims.

REFERENCES

1) D. Ueda, H. Takagi, and G. Kano, "A New Vertical Power MOSFET Structure with Extremely Reduced On-Resistance," IEEE Trans. Electron Dev. ED-32, No. 1, pp. 2-6, January 1985.
2) D. Ueda, H. Takagi, and G. Kano, "Deep-Trench Power MOSFET with An Ron Area Product of 160 mΩ-mm$^2$," IEEE IEDM Tech. Digest, pp. 638-641, 1986.
3) D. Ueda, H. Tagaki, and G. Kano, "An Ultra-Low On-Resistance Power MOSFET Fabricated by Using a Fully Self-Aligned Process," IEEE Trans. Electron Dev. ED-34, No. 4, pp. 926-930, April 1987.
4) H. R. Chang, R. D. Black, V. A. K. Temple, W. Tantraporn, and B. J. Baliga, "Self-Aligned UMOSFET's with a Specific On-Resistance of 1 mΩ-cm$^2$," IEEE Trans. Electron Dev. ED-34, No. 11, pp. 2329-2334, November 1987.
5) H. R. Chang, B. J. Baliga, J. W. Kretchmer, and P. A. Piacente, "Insulated Gate Bipolar Transistor (IGBT) with a Trench Gate Structure," IEEE IEDM Tech. Digest, pp. 674-677, 1987.
6) S. Mukherjee, M. Kim, L. Tsou, and M. Simpson, "TDMOS-An Ultra-Low On-Resistance Power Transistor," IEEE Trans. Electron Dev. ED-35, No. 12, p. 2459, December 1988.
7) C. Bulucea, M. R. Kump, and K. Amberiadis, "Field Distribution and Avalanche Breakdown of Trench MOS Capacitor Operated in Deep Depletion," IEEE Trans. Electron Dev. ED-36, No. 11, pp. 2521-2529, November 1989.
8) K. Shenai, W. Hennessy, M. Ghezzo, D. Korman, H. Chang, V. Temple, and M. Adler, "Optimum Low-Voltage Silicon Power Switches Fabricated Using Scaled Trench MOS Technologies," IEEE IEDM Tech. Digest pp. 793-797, 1991.
9) K. Shenai, "A 55-V, 0.2-mΩ-cm$^2$ Vertical Trench Power MOSFET," IEEE Electron Dev. Left. EDL-12, No. 3, pp. 108-110, March 1991.
10) U.S. Pat. No. 4,994,871, Feb. 19, 1991, H. R. Chang, et al., "Insulated Gate BiPolar Transistor with Improved Latch-up Current Level and Safe Operating Area."

We claim:
1. A method of making a recessed gate field effect power MOS device, the method comprising:
  forming a substrate (20) including first and second doped layers (24, 26) of first and second opposite dopant polarities to define a body region adjoining an upper surface of the substrate and an underlying drain region;
  forming a trenching protective layer (30) on the upper surface (28) of the substrate;
  masking and patterning the trenching protective layer to define an exposed first area (46) and a protected second area of the upper surface of the substrate demarcated by opposite sidewalls of the trenching protective layer;
  forming sidewall spacers (44) having inner surfaces (48) contacting opposite sidewalls of the trenching protective layer (30) and outer surfaces (47) spaced a predetermined spacing (54) from the sidewalls of the trenching protective layer;
  forming in the first area (46) of the substrate, between the outer surfaces (47) of the sidewall spacers (44), a first trench (50) having sidewalls aligned relative to the outer surfaces (47) of the sidewall spacers and extending at least through the layer (26) defining the body region to a bottom wall at least a predetermined depth (56) from the upper surface of the substrate;
  forming a gate oxide layer (60) on the first trench sidewalls;
  filling the first trench with polysilicon (62) to a level (64) spaced between the upper surface of the substrate and a top surface of the trenching protective layer (30);
  applying a protective layer (68) selectively over the polysilicon (62) filled into the first trench, between the sidewall spacers (44) and in contact with the outer surfaces (47) of the sidewall spacers;

removing the trenching protective layer to expose the second area of the upper surface (28') of the substrate between the inner surfaces (48) of the sidewall spacers;

doping the second area of the upper surface (28') of the substrate between the gate oxide layer (60) on the trench sidewalls with dopant of said second dopant polarity to form a source region (72) atop the body region (26');

forming, in the second area of the substrate (28') between the inner surfaces (48) of the sidewall spacers (44), a second trench (80) having sidewalls aligned relative to the inner surfaces of the sidewall spacers and extending through the layer (72) defining the source region to a bottom wall in the body region (26") of the substrate; and depositing a source conductive layer (94) in the second trench in contact with the source region and the body region;

the second trench (80) through the source region and body region defining vertically-oriented source and body layers (86, 90) stacked along the gate oxide layer (60) on opposite sidewalls of the second trench (80) and having a lateral thickness (88) established by the predetermined spacing of the inner and outer surfaces of the sidewall spacers.

2. A method according to claim 1 in which the body layer (90) is sized to a lateral thickness (88) less than a vertical height (83) thereof.

3. A method according to claim 1 in which the body layer (90) is sized to a lateral thickness (88) less than 1 μm.

4. A method according to claim 3 in which the vertically-oriented body layer (90) is doped to a first doping concentration and a laterally-extending portion of the body region (26") is doped to a second doping concentration greater than the first doping concentration.

5. A method according to claim 1 including forming an insulative layer (68) between the sidewall spacers (44) over the source conductor (94) to electrically isolate the gate conductor (62) from the source conductor.

6. A method according to claim 1 in which the second trench is formed to a depth (82) such that the source conductive layer (94) extends vertically along both the source and body layers (86, 90) to form a short across a PN junction formed therebetween and contacts a laterally-extending upper surface of the body region (26) at a position spaced below the PN junction.

7. A method according to claim 1 in which substrate (20) includes a base layer (122) underlying the first doped layer (24) and doped with a dopant of said first polarity to a doping concentration greater than a doping concentration of the first doped layer (24) to form a three-layer power MOSFET.

8. A method according to claim 7 in which the first trench is formed to a depth (156) extending into the base layer and the gate oxide layer is formed in a first portion (160A) having first thickness in a lower portion of the trench and a second portion (160B) having a second thickness in an upper portion of the trench, the first thickness being greater than the second thickness.

9. A method according to claim 1 in which substrate (20) includes a base layer (22) underlying the first doped layer (24) and doped with a dopant of said second polarity to define a four-layer PNPN device.

10. A method according to claim 9 in which the first trench is formed to a depth (256) within the first layer spaced above the base layer and the gate oxide layer is formed in a first portion (260A) having a first thickness in a lower portion of the trench and a second portion (260B) having a second thickness in an upper portion of the trench, the first thickness being greater than the second thickness.

11. A method according to claim 1 in which:
the first trench is formed to a first depth;
a first gate oxide layer (160A, 260A) is formed with a first thickness;
a filler material is filled into the trench to a second depth less than the first depth;
a portion of the first gate oxide layer is removed above the filler material;
a second gate oxide layer (160B, 260B) is formed with a second thickness; and
the trench is filled above said second depth with a conductive gate material.

12. A method according to claim 11 in which the filler material includes polysilicon and the second gate oxide layer (160B, 260B) is formed over the polysilicon.

13. A method according to claim 11 in which the filler material includes photoresist and the photoresist is removed before the second gate oxide layer is formed.

14. A method according to claim 1 in which the trenching protective layer comprises a thin oxide layer (32) formed atop the upper substrate surface, a polysilicon layer deposited on the thin oxide layer, and a thick oxide layer (36) deposited on the polysilicon layer.

15. A method according to claim 1 in which the trenching protective layer (330) comprises a first oxide layer (32) formed atop the upper substrate surface, a first polysilicon layer (34, 334) deposited on the first oxide layer, a second oxide layer (36, 336) formed on the first polysilicon layer; and a second polysilicon layer (338) deposited on the second oxide layer.

16. A method according to claim 1 in which the first trench and the gate oxide layer and gate conductor within the first trench define a gate structure which is laterally patterned in two dimensions to define an interconnected matrix enclosing a plurality of islands, each island being formed with said second trench extending into a central portion thereof and containing a downward extending finger of source conductor surrounded by a portion of the source and body layers (86, 90) including a vertical channel having a width defined in each island by a perimeter of the island.

17. A method according to claim 16 in which the body layer (90) is sized to a lateral thickness (88) proportionate to the predetermined spacing (52) between the inner surfaces (48) and outer surfaces (47) of the sidewall spacers (44).

18. A method according to claim 1 including forming at least two of said first trenches at a predetermined lateral spacing and forming said second trench between the first trenches at a spacing therefrom determined by said predetermined spacing (52) between the inner and outer surfaces of the sidewall spacers, the first trenches each containing the gate oxide layer and gate conductor, the source conductor extending into the second trench and contacting the vertically oriented source and body layers (86,90) on opposite sides thereof.

19. A method according to claim 18 in which the body layer (90) is sized to a lateral thickness (88) proportionate to the predetermined spacing (52) between the inner surfaces (48) and outer surfaces (47) of the sidewall spacers (44).

20. A method according to claim 1 in which the body layer (90) is sized to a lateral thickness (88) proportionate to the predetermined spacing (52) between the inner surfaces (48) and outer surfaces (47) of the sidewall spacers (44).

* * * * *

UNITED STATES PATENT AND TRADEMARK OFFICE
CERTIFICATE OF CORRECTION

PATENT NO. : 5,283,201
DATED : February 1, 1994
INVENTOR(S) : Dah Wen Tsang, et. al.

It is certified that error appears in the above-indentified patent and that said Letters Patent is hereby corrected as shown below:

In Column 2, line 14 of the Specification, please make the following change:

"dill used" to --diffused--

In Column 5, line 44 of the Specification, please make the following change:

"$10^{17} cm^{313}$" to --$10^{17} cm^{-3}$--

In Column 6, line 13 of the Specification, please make the following change:

"500142000Å" to --500-2000Å--
Column 6, line 26, delete"@"--.
Column 8, line 22 delete "18 5000Å" to -- 5000Å--
Column 10, line 19, delete "4"--.
Column 11, line 25, delete "lay thicker" to --layer 334 is thicker--.
Column 12, line 25, delete "Left." to Lett.--.

Signed and Sealed this

Twelfth Day of September, 1995

Attest:

BRUCE LEHMAN

Attesting Officer      Commissioner of Patents and Trademarks